United States Patent [19]
Salbert et al.

[11] Patent Number: 5,804,925
[45] Date of Patent: Sep. 8, 1998

[54] MODULATOR FOR GENERATING HIGH POWER ELECTRIC PULSES

[75] Inventors: Heinrich Salbert, Saarwellingen; Klaus-Peter Jüngst, Stutensee, both of Germany

[73] Assignee: Forschungszentrum Karlsruhe GmbH, Karlsruhe, Germany

[21] Appl. No.: 835,375

[22] Filed: Apr. 7, 1997

Related U.S. Application Data

[63] This is a continuation-in-part of PCT/EP95/03968, Oct. 9, 1995.

[30]     Foreign Application Priority Data

Nov. 9, 1994 [DE] Germany ........................... 44 40 013.6

[51] Int. Cl.⁶ .................................................... H05B 37/00
[52] U.S. Cl. ..................... 315/209 R; 315/219; 315/224; 315/289
[58] Field of Search .............................. 315/289, DIG. 5, 315/209 R, 219, 224, 226, 200 R, 246, 276, DIG. 2, 291

[56]    References Cited

U.S. PATENT DOCUMENTS

| 4,247,803 | 1/1981 | Walz ....................................... 315/289 |
| 4,670,662 | 6/1987 | Goldstein et al. . |

FOREIGN PATENT DOCUMENTS

| 0 196 960 | 10/1986 | European Pat. Off. . |
| 2 538 942 | 7/1984 | France . |

*Primary Examiner*—Benny T. Lee
*Assistant Examiner*—David H. Vu
*Attorney, Agent, or Firm*—Klaus J. Bach

[57]    ABSTRACT

In a modulator for generating high-power electric pulses to a load which modulator includes an energy accumulator circuit with an inductive accumulator and a power switch and a load circuit bridging the power switch and including a capacitive energy accumulator and a second switch which is controlled so as to be always in a state complementary to the state of the power switch such that, during a pulse, the two accumulators are arranged in series, and a current source which is arranged in parallel with the capacitive energy accumulator with a predetermined polarity up to an adjustable voltage whereby the initial conditions for the electrical pulse to be generated are determined.

1 Claim, 2 Drawing Sheets

MODULATOR FOR GENERATING HIGH POWER ELECTRIC PULSES

This is a Continuation-in-Part application of international application PCT/EP95/03968 filed Oct. 9, 1995, designating the U.S. and claiming the priority of German application P 44 40 013.6 filed Nov. 9, 1994.

BACKGROUND OF THE INVENTION

The invention resides in a modulator for generating high-power electric pulses on a load.

The generation of such high-power electric pulses requires energy storage devices which are capable of storing the energy required for such pulses and supply that energy to a load within a very short time. The pulse duration varies, depending on the application, from less than $10^{-9}$ sec. in radar application, to up to $10^{-3}$ sec for linear accelerators. For the generation of pulses in the nano- and microseconds range pulse-forming networks (PFN) are utilized; however, the utilization of such pulse-forming networks in the milliseconds range is problematic because of the large amount of energy to be stored. For the generation of relatively long high-power electric pulses as they are required for example for the energization of klystrons in linear accelerators, devices are needed which utilize large capacitances or inductivities for the storage of the energy.

DOS 41 00 719 discloses an electrical circuit for the stabilized generation of high-voltage impulses. It comprises a voltage source and, connected thereto, an energy storage structure which is composed of an energy storage arranged in series with a power switch.

DOS 41 04 386 furthermore discloses an impulse generator for providing impulses for electric fences with a power switch which is bridged by a load branch. The load branch consists of a serial arrangement of the load and a capacitive energy storage structure.

A modulator which utilizes capacitive storage structures has been developed by the Fermi National Accelerator Laboratories (see conference report of the twentyfirst International Power Modulator Symposium, 1994; Jun. 27–30, 1994, Western South Coast, Plaza Hotel, Costa Mesa, Calif.; H. Pfeffer et al., 3.3: "A Long-Pulse Modulator for Reduced Size and Cost"). This modulator utilizes a switched condenser bank of moderate size whose voltage drops during the pulse to about 20% of the initial voltage. This large voltage drop is compensated for by a resonant LC-circuit. The condenser bank is connected to the higher side of the primary input of a pulse transformer by way of a series of Gate-Turn-Off thyristors (GTO). The resonance circuit is connected to the lower connection of the primary side of the pulse transformer. The output pulse remains at almost the same energy level over the almost 2 microseconds duration of the pulse top period. The efficiency measured from the switch to the klystron including the energy losses in the build-up period is about 85%.

In a conference presentation given during the above mentioned Power Modulator Symposium in Costa Mesa, H. Salbert et al. reported under 3.4: "Generation of High-Power Pulses Using a SMES", that for the generation of high-power pulses a power modulator is used for the linear accelerator which includes a superconductive magnetic energy storage SMES. This power modulator is supposed to generate pulses of 3 KV at 300 A with a duration of 2 microseconds and a repetition rate of 10 Hz. For this modulator, a fast power switch consisting of IGBTs and a superconductive energy storage device are under development. For sufficient current capacity and voltage resistance, the power switch comprises serially arranged groups of parallel gate-mounted bipolar transistors (IGBT). The operating principle of such a pulse modulator is simple and will be described briefly:

First, the energy circuit comprising the energy storage device and the closed power switch is charged by a voltage source up to a predetermined current. Then the power switch is opened so that the current commutates to the load circuit arranged parallel to the power switch. If the load is a klystron, it can be assumed to be an ohmic load.

The time depending is then established by the equation:

$$v(t) = v_{source} + R \times I_{SMES}(0) \times e^{-R/L \times t}$$

wherein $v_{source}$ is the voltage of the voltage source, R is the ohmic load resistance and L is the inductivity of the SMES. Consequently, a power pulse is generated in the klystron whose amplitude is proportional to the square of the current flowing through the energy storage device.

In addition to the power of the pulse generated, the voltage drop during the pulse duration is an important value. With this value, the required inductivity and consequently, the possible energy content of the energy storage device, can be determined. With very flat pulse tops with small declines that is pulses with very short pulse durations with respect to the time constant $\tau = L/R$ particularly, the energy to be stored must be a multiple of the pulse energy. (In the conference, paper mentioned earlier, a ratio of 25 is provided). This requirement determines for the most part, the costs for such a modulator since the energy storage device must be designed in accordance with this requirement.

Furthermore, the voltage drop during the pulse is limited by the alternating current losses of the superconductor used in the energy storage device. An excessively rapid discharge (large di/dt) of the energy storage device causes alternating current losses in the superconductor which finally could lead to a quench (transition from a superconductive to a normally conductive state). As a result, a substantially more expensive superconductor type may have to be employed which is not subject to the limitations at the given parameters.

It is the principal object of the present invention to provide a pulse modulator whose energy storage inductivity and whose ratio of stored energy to pulse energy are relatively small.

SUMMARY OF THE INVENTION

In a modulator for generating high-power electric pulses to a load which modulator includes an energy accumulator circuit with an inductive accumulator and a power switch and a load circuit bridging the power switch and including a capacitive energy accumulator and a second switch which is controlled so as to be always in a state complementary to the state of the power switch such that, during a pulse, the two accumulators are arranged in series, and a current source which is arranged in parallel with the capacitive energy accumulator with a predetermined polarity up to an adjustable voltage whereby the initial conditions for the electrical pulse to be generated are determined.

The pulse modulator according to the invention accordingly does not have only a single energy accumulator that is the inductive energy storage (SMES), but it includes in the load branch a series circuit comprising a condenser and a second switch and this condenser is charged by way of a separate current source. During the pulse, there is accordingly a series resonant circuit, which is achieved with the two switches which are always in different states.

The advantage of such a modulator is that, after opening the power switch and concurrent closing of the second switch, that is, after a predetermined current has flown through the inductive energy accumulator and the predetermined voltage is present at the capacitive energy accumulator, two energy accumulators are in the load circuit. As a result, the discharge voltage at the inductive accumulator, that is at the coil, can be adjusted to any desired value by way of the voltage at the capacitive energy accumulator that is the capacitor. It can be adjusted, for example, to substantially smaller values resulting in a substantially smaller discharge of the coil.

Furthermore, with such a modulator arrangement, the pulse top is not determined by the time constant L/R; rather, its form depends on the initial conditions, beginning at the point in time when the second switch becomes conductive and on the charge change behavior of the L-R-C-series resonant circuit present during the pulse duration.

The component dimensioning of the modulator depends on the load to be operated. Consequently, the only unknowns to be determined are the inductivity of the energy accumulator and the capacity of the condensers. By suitable dimensioning of these two components and selection of the initial conditions (starting at the point in time at which the switch becomes conductive), the energy stored in the modulator can be reduced by about three times of the pulse energy.

The ratio of pulse pause to pulse duration determines the voltage at the voltage source. The source voltage is small when the ratio is large—and vice versa. Consequently, the voltage source can be easily controlled. An uncontrollable voltage source would be sufficient only with a constant pulse-pause ratio and constant initial conditions. As a result, the initial energy stored in the inductive energy accumulator can be about one tenth of the initial energy to be stored in the inductive energy accumulator of the state-of-the-art apparatus without any reduction in the pulse energy. Such a modulator permits the use of a substantially less expensive superconductor since there are no rapid changes, that is, there are much smaller current peaks. As a result, a substantially more economical modulator design can be employed. In addition, the load on the power supply network is effectively reduced, that is disturbing reactions on the power supply network are avoided since the energy consumed during the pulse is taken solely from the capacitive and inductive energy accumulators which are both charged during the pulse pause.

An embodiment of the invention will be described below, on the basis of the accompanying drawings.

DESCRIPTION OF AN EMBODIMENT

Figure 1:
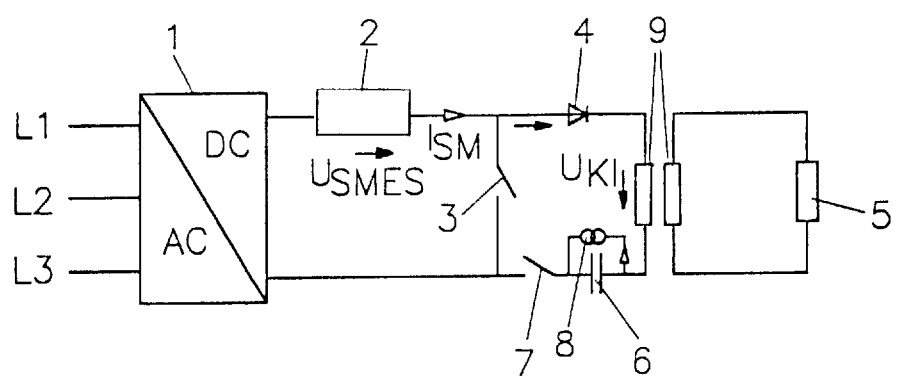
FIG. 1 shows schematically a circuit arrangement of the pulse modulator with current and voltage sources according to the invention.

The DC voltage source 1 for the pulse modulator as shown in FIG. 1 is in the given exemplary embodiment a controlled three-phase AC-DC bridge. The power switch 3 as well as the second switch 7 consist of serially arranged groups of parallel-switched, gate insulated bipolar transistors (IGBT). The load 5 is a klystron with a purely ohmic character. If necessary, the voltage for the klystron is increased by way of the pulse transformer 9 as it is indicated in FIG. 1. A high-current diode 4 in the load circuit prevents a current reversal. The current source 8 for charging the condenser 6 is a controllable network power supply unit by which the predetermined voltage can be provided for the condenser 6. Common equipment such as measuring apparatus, protective circuitry and associated electronic controls are not shown in FIG. 1 as they are well known in the respective art and would only confuse the principle to be shown herein.

As mentioned earlier, the modulator comprises a system of two energy accumulators 2, 6, that is, the inductive energy accumulator 2, which in the given example is a superconductive magnetic energy accumulator (SMES), and the capacitive energy accumulator 6 disposed in the load circuit. The accumulator 6 will be discussed below in greater detail in an analytic manner with regard to the pulse duration.

The charging of the inductive energy accumulator 2 up to the predetermined current is described earlier. At the same time, that is, during the charging of the accumulator 2, the condenser 6 in the load circuit is charged up to the predetermined voltage. As a result, the predetermined initial conditions for the pulse current and the voltage at the condenser 6 are set so that the modulator can then be operated, that is, the switches 3 and 7 can be actuated concurrently to their respective opposite positions.

When the second switch is in a conductive state then the voltage at the pulse transformer 9, when neglecting the source voltage at the voltage source 1, is:

$$u_{KL}(t) = u_{SMES}(t) + u_c(t)$$

Neglecting the source voltage is justified since the input voltage at the pulse transformer 9 is about 3 kV and the voltage at the voltage source 1 is only 60 V. In other words, the energy contribution of the voltage source during the pulse duration is negligible. The discharge voltage at the SMES 2 can then be adjusted freely by way of $u_c(0)$. This is possible as, with the relation, $$u(t) = -L \times di/dt$$

and also with the voltage $V_c(0)$, $dI3/dt$ can be adjusted.

During a pulse, the current in the Laplace-range can be calculated by the following relationship:

$$I(s) = u(s)/(R + sL + 1/sC) + 1/s \times (I(0)) \times sL - U_c(0)/(R + sL + 1/sC)$$

By neglecting the component generated by the source voltage U(s), the current has only one transient component provided by the initial charges of the SMES 2 and the condensers 6:

$$I(s) = 1/s \times (I(0) \times sL - U_c(0))/(R + sL + 1/sC)$$

after reverse transformation in the time range the following result is obtained:

$$i(t) = I(0) \times (e^{-at}\cos(bt) - a/b \times e^{-at}\sin(bt)) - U_c/L \times 1/b \times e^{-at}\sin(bt)$$

wherein $$a = R/2L$$

is the load provided by the double energy storage inductivity and $$b^2 = 1/CL - a^2$$

with C giving the condenser capacity.

The equation for i(t) accordingly describes the transient discharge of the energy accumulators C and L.

For use of the circuit as a pulse modulator only pulse times<2 ms are of interest. During this time, any di/dt and also a di/dt>0 can be achieved by an appropriate selection of the initial conditions. The requirement for a pulse top decrease<2% can accordingly be satisfied.

In the exemplary embodiment, the components of the pulse modulator are dimensioned as follows:

| | |
|---|---|
| the klystron | R = 8.9 Ω |
| inductivity | L = 0.1 H |
| current | $I_{SMES}$ = 1125 A |
| condenser voltage | $V_c$ = 1100 V |
| condenser capacity | C = 0.44 mF |

Figure 2:
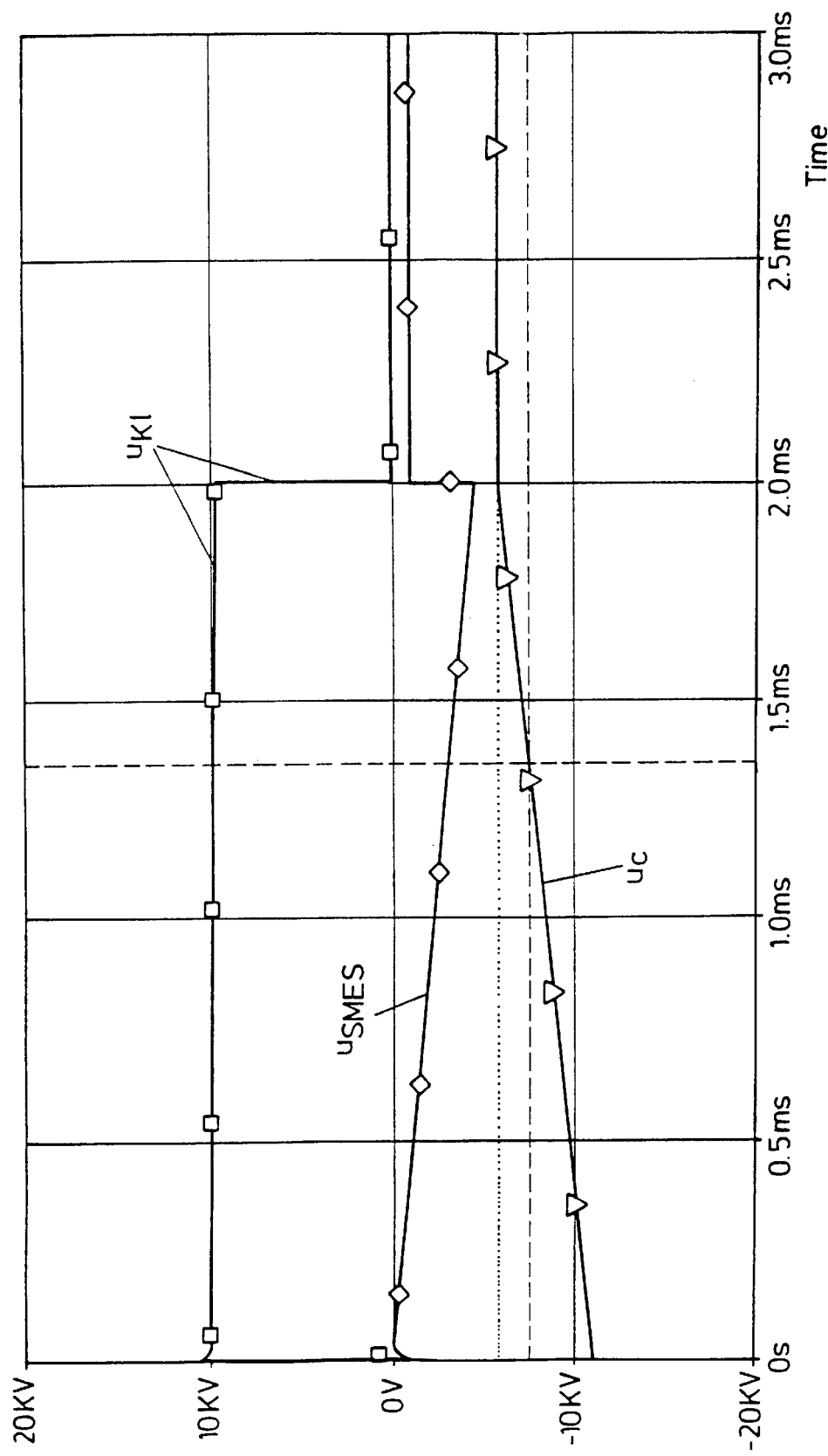
FIG. 2 is a diagram showing the load voltage and the two energy accumulator voltages over time.

FIG. 2 shows the voltage $u_{KL}(t)$ on the load, the condenser voltage $V_C(t)$ and the voltage at the coil during pulse time and after the end of the pulse.

The invention claimed is:

1. A modulator for generating a high-power electric pulse on a load, comprising: a voltage source; an energy accumulator circuit connected to said voltage source including an inductive energy accumulator and a power switch arranged in series with said inductive energy accumulator; and a load circuit bridging said power switch comprising a current diode arranged in series with an electrical load, a capacitive energy accumulator, a second switch controlled so as to be always in a state complementary to that of said power switch, and a current source arranged in parallel circuit relationship with said capacitive energy accumulator and adapted to charge said capacitive energy accumulator with a predetermined polarity up to an adjustable voltage whereby initial conditions for an electrical pulse to be generated are determined.

* * * * *